United States Patent
Raghurama et al.

(10) Patent No.: US 9,231,053 B2
(45) Date of Patent: Jan. 5, 2016

(54) LIGHT EMITTING DIODES HAVING ZINC OXIDE FIBERS OVER SILICON SUBSTRATES

(71) Applicant: HONEYWELL INTERNATIONAL INC., Morristown, NJ (US)

(72) Inventors: Raju Addepalle Raghurama, Karnataka (IN); Basavaraja Sangappa Devaramani, Karnataka (IN)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 14/314,177

(22) Filed: Jun. 25, 2014

(65) Prior Publication Data

US 2014/0374748 A1 Dec. 25, 2014

Related U.S. Application Data

(60) Provisional application No. 61/839,282, filed on Jun. 25, 2013.

(51) Int. Cl.
*H01L 29/06* (2006.01)
*H01L 29/20* (2006.01)
(Continued)

(52) U.S. Cl.
CPC ........ *H01L 29/0676* (2013.01); *H01L 21/0262* (2013.01); *H01L 21/02381* (2013.01); *H01L 21/02433* (2013.01); *H01L 21/02472* (2013.01); *H01L 21/02513* (2013.01); *H01L 21/02554* (2013.01); *H01L 21/02576* (2013.01); *H01L 21/02579* (2013.01); *H01L 21/02603* (2013.01); *H01L 21/02645* (2013.01); *H01L 21/02653* (2013.01); *H01L 21/02658* (2013.01); *H01L 29/0673* (2013.01); *H01L 33/12* (2013.01);
(Continued)

(58) Field of Classification Search
CPC . H01L 29/0673; H01L 29/2003; H01L 29/22; H01L 33/12
See application file for complete search history.

(56) References Cited

U.S. PATENT DOCUMENTS 7,989,244 B2  8/2011  Kim et al.
8,278,194 B2  10/2012 Wuu et al.
(Continued)

FOREIGN PATENT DOCUMENTS

CN    102255026 B   8/2013
FR    2978601 A1    2/2013

OTHER PUBLICATIONS

Bayram, C. et al.; Engineering future light emitting diodes and photovoltaics with inexpensive materials: Integrating ZnO and Si into GaN-based devices; Proc. of SPIE vol. 8626, 86260L—© 2013 SPIE—CCC code: 0277-786X/13.

(Continued)

*Primary Examiner* — Whitney T Moore
(74) *Attorney, Agent, or Firm* — Ingrassia Fisher & Lorenz, P.C.

(57) ABSTRACT

Semiconductor devices useful as light emitting diodes or power transistors are provided. The devices produced by depositing a Zn—O-based layer comprising nanostructures on a Si-based substrate, with or without a metal catalyst layer deposited therebetween. Furthermore, a pair of adjacent p-n junction forming layers is deposited on the ZnO-based layer, where one of the pair is an n-type epitaxial layer, and the other is a p-type epitaxial layer. One or more epitaxial layers may, optionally, be deposited between the ZnO-based layer and the pair of adjacent p-n junction forming layers.

20 Claims, 1 Drawing Sheet

(51) Int. Cl.
*H01L 29/22* (2006.01)
*H01L 33/28* (2010.01)
*H01L 33/30* (2010.01)
*H01L 33/12* (2010.01)
*H01L 21/02* (2006.01)
*H01L 29/267* (2006.01)

(52) U.S. Cl.
CPC ............. *H01L 29/2003* (2013.01); *H01L 29/22* (2013.01); *H01L 29/267* (2013.01)

(56) References Cited

U.S. PATENT DOCUMENTS

| | | | |
|---|---|---|---|
| 8,278,656 B2 | 10/2012 | Mattmann et al. | |
| 8,395,152 B2 | 3/2013 | Rao et al. | |
| 8,435,816 B2 | 5/2013 | Xiong et al. | |
| 8,709,839 B2 | 4/2014 | Lee et al. | |
| 2007/0111368 A1* | 5/2007 | Zhang et al. | 438/99 |
| 2009/0267188 A1* | 10/2009 | Piner et al. | 257/613 |
| 2010/0117070 A1* | 5/2010 | Adekore et al. | 257/43 |
| 2011/0284061 A1* | 11/2011 | Vanecek et al. | 136/255 |
| 2012/0055532 A1 | 3/2012 | Wang et al. | |
| 2012/0061660 A1 | 3/2012 | Lu et al. | |
| 2012/0146020 A1 | 6/2012 | Ryu et al. | |
| 2012/0309172 A1 | 12/2012 | Romano et al. | |
| 2013/0109108 A1 | 5/2013 | Lin et al. | |
| 2013/0187124 A1 | 7/2013 | Zhang et al. | |
| 2013/0187127 A1 | 7/2013 | Yi et al. | |

OTHER PUBLICATIONS

Rajan, A. et al.; Novel Method for Reclaim/Reuse of Bulk GaN Substrates using Sacrifical ZnO Release Layers; Proc. of SPIE vol. 8987 898719-1; © 2014 SPIE CCC code: 0277-786X/14.

Rogers, D.J. et al.; Novel Process for Direct Bonding of GaN onto Glass Substrates using Sacrificial ZnO Template Layers to Chemically Lift-off GaN from c-sapphire; Proc. of SPIE vol. 8263, 82630R—© 2012 SPIE—CCC code: 0277-786X/12.

Chuang, S. et al.; Thin Film GaN LEDs Using a Patterned Oxide Sacrificial Layer by Chemical Lift-Off Process; IEEE Photonics Technology Letters, vol. 25, No. 24, Dec. 15, 2013.

Wei, X. et al.; Fabrication and Properties of ZnO/GaN Heterostructure Nanocolumnar Thin Film on Si (111) Substrate; Nanoscale Research Letters, a SpringerOpen Journal; Wei et al. Nanoscale Research Letters 2013, 8:112.

Abbasi, M. A. et al.; The Fabrication of White Light-Emitting Diodes Using the n-ZnO/NiO/p-GaN Heterojunction with Enhanced Luminescence; Nanoscale Research Letters, a SpringerOpen Journal; Abbasi et al. Nanoscale Research Letters 2013, 8:320.

Kim, J. et al.; Highly Efficient InGaN/GaN Blue LED on 8-inch Si (111) Substrate; Proc. of SPIE vol. 8262 82621D-1; 2012 SPIE CCC code: 0277-786X/12.

Onomura, M.; Highly Efficient InGaN MQW LEDs Grown on 200 mm Si Substrates; Proc. of SPIE vol. 8986 898620-1; 2014 SPIE CCC code: 0277-786X/14.

* cited by examiner

LIGHT EMITTING DIODES HAVING ZINC OXIDE FIBERS OVER SILICON SUBSTRATES

CROSS-REFERENCE TO RELATED APPLICATIONS

This application claims the benefit of U.S. Provisional Application No. 61/839,282, filed Jun. 25, 2013, under 35 USC 119(e).

TECHNICAL FIELD

The disclosure generally relates to semiconductor devices and more particularly relates to diode devices useful for light emitting diodes or power transistors that are produced with Si-based substrates a Zn-based layer overlaid in the Si-based substrate and comprising nanostructures chosen from nanowires, nanofibers and nanorods, and upon which a pair of p-n junction forming layers are overlaid.

BACKGROUND

Semiconductor devices having metal oxide layers of adjacent epitaxial p-type and n-type structures which form p-n junctions are known as semiconductor diodes, or p-n diodes, and are useful as light emitting diodes (LEDs) and power transistors. The further development of this technology has enabled their efficiency to rise exponentially, making them more widely useful in various applications. Among recent research trends are those that seek to reduce costs of producing semiconductor diodes, while enlarging the diode surface area and maintaining high performance and efficiency.

Generally, semiconductor diodes are manufactured using single crystal substrates of GaN, ZnO, $Al_2O_3$ (sapphire), SiC, $SiO_2$ (quartz) and silicon. Large area substrates (e.g., greater than about 15.24 centimeters (cm) (6 inches)) of single crystal GaN and ZnO are not widely used due to their high cost, even though their lattice matching with p-type and n-type films is almost equal, which permits growth of superior quality single crystalline epitaxial films for making the best LEDs.

Silicon is known to be among the least costly of the suitable substrate materials, with high quality single crystal wafers having large surface area with about 20.32 cm (8 inches) to about 30.48 cm (12 inches) in diameter, or greater, available for deposition of metal oxide layers thereon. However, silicon substrates have their own drawbacks, including large lattice mismatch and increasing flexibility as their surface area increases, which hinders growth of high quality epitaxial layers of GaN, ZnO, or other oxides thereon, and subjects the deposited epitaxial layers to stress that increases the risk of fracture or other distortion of the crystal structures, respectively.

Many techniques have been developed to reduce the lattice mismatch, such as by first depositing MgO thin layers on the Si-based substrate, then growing an AlGaN layer, and finally depositing the GaN p- and n-type epitaxial layers. Still, there remain unacceptable degrees of defects in the quality of the epitaxial layers, which reduce the efficiency of semiconductor diodes produced this way.

Accordingly, it is desirable to provide semiconductor devices that use less expensive Si-based substrates for semiconductor diodes having epitaxial semiconductor layers made of GaN, notwithstanding the lattice mismatch between Si and GaN. Furthermore, other desirable features and characteristics of the present invention will become apparent from the subsequent detailed description of the invention and the appended claims, taken in conjunction with the accompanying drawings and this background of the invention.

BRIEF SUMMARY

A semiconductor device is provided which comprises: a Si-based substrate; a ZnO-based layer comprising nanostructures overlaying the Si-based substrate; a pair of adjacent p-n junction forming layers overlaying the ZnO-based layer, wherein one of the pair is an n-type epitaxial layer, and the other is a p-type epitaxial layer; and a top electrode layer overlaying the pair of adjacent p-n junction forming layers.

In another embodiment, a semiconductor device is provided, comprising: a Si-based substrate; a catalyst-bearing layer overlaying the Si-based substrate; ZnO-based layer comprising nanostructures overlaying the catalyst-bearing layer; a pair of adjacent p-n junction forming layers overlaying the ZnO-based layer; and a top electrode layer overlaying the pair of adjacent p-n junction forming layers. The catalyst-bearing layer comprising a metal chosen from: Ti, Ni, Co, Cr, Fe, Mn, Au and Pt. One of the pair of adjacent p-n junction forming layers is an n-type epitaxial layer, and the other is a p-type epitaxial layer.

Still another embodiment provides an integrated circuit comprising: a substrate; and a semiconductor device disposed on the substrate. More particularly, the semiconductor device comprises: a Si-based substrate; a ZnO-based layer comprising nanostructures overlaying the Si-based substrate; a pair of adjacent p-n junction forming layers overlaying the ZnO-based layer, wherein one of the pair is an n-type epitaxial layer, and the other is a p-type epitaxial layer; and a top electrode layer overlaying the pair of adjacent p-n junction forming layers.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

As already mentioned, large diameter (e.g., greater than about 15.24 cm (6 inches)) Si(111) substrates are promising for the production of GaN-based semiconductors. However, epitaxial growth of GaN-based epitaxial layers directly on Si substrates without cracks is difficult in manufacturing because of large lattice and thermal expansion mismatches. More particularly, the lattice mismatch is >16%, which causes a high dislocation density in the GaN epitaxial layers. The thermal expansion mismatch between GaN and Si is >50%, which induces the tensile stress during the post-growth cooling process and eventually generates cracks in the GaN layers.

The various embodiments herein grow a layer of zinc oxide (ZnO) nanostructures over silicon Si(100) or Si(111) substrates, with or without a metal catalyst comprising gold, cobalt or iron. A high quality ZnO-based layer of nanostructures, such as a fiber bed, is created. On top of this ZnO fiber bed, a thin epitaxial ZnO film is grown. Here too, the method of depositing the ZnO fiber bed reduces the defects in the ZnO epitaxial film and, thus, the defect-free film is used as substrate to grow well-formed GaN p-n junctions. On top of this LED structure, again a Ga-doped ZnO epitaxial layer is grown and may serve as a top electrode since it is highly transparent to visible radiation, allowing more of the light output produced to escape the semiconductor device as compared to conventional metal transparent layers.

Figure 1:
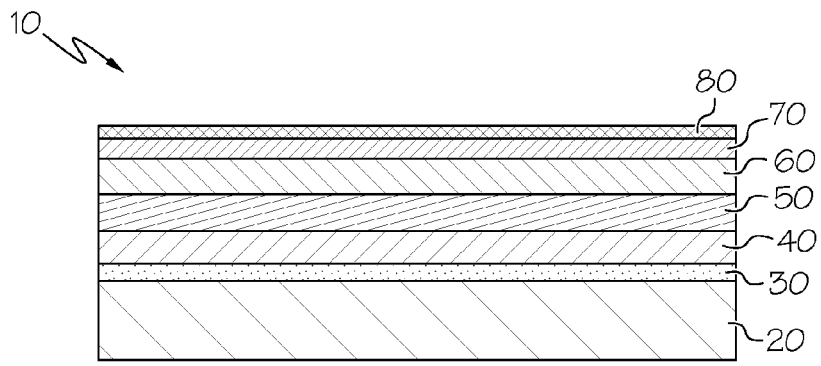
FIG. 1 is a cross-sectional view of a semiconductor device showing the layers thereof in accordance with an exemplary embodiment.

More particularly, as shown in FIG. 1, a semiconductor device 10, useful as a light emitting diode (LED) or a power transistor, comprises a Si-based substrate 20; a ZnO-based layer 40 comprising nanostructures (not shown per se) overlaying the substrate 20; a pair of adjacent p-n junction forming layers overlaying the ZnO-based layer 40, wherein one of said pair is an n-type epitaxial layer 60 and the other is a p-type epitaxial layer 70; and a top electrode layer 80 overlaying the n-type and p-type epitaxial layers 60, 70 of said pair of adjacent p-n junction forming layers. As used herein, the terms "overlays" and "overlaying" are used to describe the position of a particular layer in the semiconductor relative to a substrate or other layers. When a particular layer is described as "overlaying" a substrate or another layer, this means that either the particular layer is "on" the substrate or other layer such that the particular layer makes physical contact with the substrate or other layer, or the particular layer is "over" the substrate or other layer such that an intervening layer may be positioned between the particular layer and the substrate or other layer.

As shown in the embodiment of FIG. 1, the semiconductor device 10 may, optionally, further comprise a catalyst-bearing layer 30 comprising a metal chosen from: Ti, Ni, Co, Cr, Fe, Mn, Au, Pt, and combinations thereof. Preferably the metal is chosen from Co, Fe and Au, and combinations thereof. Where present, the catalyst-bearing layer 30 overlays the substrate 20, and the ZnO-based layer overlays the catalyst-bearing layer 30.

Additionally, the semiconductor device 10 may, optionally, further comprise one or more epitaxial layers 50 wherein the one or more epitaxial layers overlay the ZnO-based layer 40, as shown in FIG. 1. Furthermore, the one or more epitaxial layers 50 are preferably overlaid by the pair of adjacent p-n junction forming layers 60, 70.

The Si-based substrate 20 is a single crystal typically comprising one or more compounds selected from the group consisting of: Si(100) and Si(111). The Si-based substrate 20 may have a diameter between about 15.24 to about 38.1 cm (about 6 to about 15 inches). For example, the diameter of the Si-based substrate may be between about 20.32 to about 30.48 cm (about 8 and about 12 inches).

The ZnO-based layer 40 comprises one or more nanostructures chosen from: nanofibers, nanowires, and nanorods. Furthermore, the ZnO-based layer comprises undoped ZnO, doped ZnO, or both, where the doped ZnO further comprises one or more elements selected from the group consisting of: Al, Ga, and In. As used herein, "nanostructures" refer to highly oriented, highly crystalline material grown in a particular direction, i.e., the growth is greater in one direction compared to the other two directions of a three-dimensional shape. Nanostructures are typically sized in the nano-scale range of about 5 to about 100 or even greater. The nanostructures of the ZnO-based layer comprise at least about 90% by weight (wt %) of the ZnO-based layer, based on the total volume of the ZnO-based layer. For example, the nanostructures of the ZnO-based layer may comprise at least about 95 wt %, or at least about 99 wt %, of the nanostructures. For example, in some embodiments, the nanostructures may include nanofibers, without any nanowires or nanorods, or they may include nanowires, without any nanofibers or nanorods. In other embodiments, the ZnO-based layer may comprise a combination of two or all three of the different types of nanostructures.

Techniques for growing ZnO-based nanostructures are known to persons of ordinary skill in the art. Since ZnO is a polar semiconductor with the (0001) planes being Zn-terminated and the (000-1) planes being O-terminated, which means these two crystallographic planes have opposite polarity and hence have different surface relaxation energies. This leads to a higher growth rate along the c-axis, which results in a pillar like structure on Si-based substrates 20 (or catalyst-bearing layers 30).

For example, catalyst-free metal-organic chemical vapor deposition (MOCVD) is one of several effective techniques used to grow ZnO nanostructures. In such a technique, typically, a thin nucleation layer of ZnO is grown at a low substrate temperature (e.g., 400° C.) first, followed by annealing. Then ZnO nanostructures are grown on the nucleation layer at a higher substrate temperature (e.g., 650° C.).

In an exemplary embodiment, the compositions of each of the one or more epitaxial layers 50 have compositions that are the same or different from one another, and each comprises an oxide selected from the group consisting of: doped or undoped GaN, doped or undoped ZnO, doped or undoped AlN, doped or undoped AlGaN, doped or undoped InGaN.

The n-type and p-type epitaxial layers 60, 70 of said pair of adjacent p-n junction forming layers may have compositions that are the same or different from each another. Each of the n-type and p-type epitaxial layers 60, 70 comprises one or more compounds selected from the group consisting of: doped or undoped GaN, doped or undoped ZnO, doped or undoped AlN, doped or undoped AlGaN, doped or undoped InGaN.

Metalorganic vapour phase epitaxy (MOVPE), also known as organometallic vapour phase epitaxy (OMVPE) or metalorganic chemical vapour deposition (MOCVD), is a chemical vapour deposition method used to produce single or polycrystalline thin films. It is a highly complex process for growing crystalline layers to create complex semiconductor multilayer structures. In contrast to molecular beam epitaxy (MBE) the growth of crystals is by chemical reaction and not physical deposition. This takes place not in a vacuum, but from the gas phase at moderate pressures (10 to 760 Torr).

The semiconductor device described above exploits the fact that ZnO nanofibers grow along the c-axis very easily, even on amorphous substrates. In an exemplary embodiment, the high quality ZnO nanofibers contemplated herein grow along the c-axis on pure Si substrates by employing metal particles of Au, Co and Fe and using vapor phase epitaxy. On these metallic fibers, a thin ZnO epitaxial film is grown using MOCVD or MBE techniques. As such, this technique is preferred for the formation of devices incorporating thermodynamically metastable alloys, and it has become a major process in the manufacture of optoelectronics.

Once the ZnO-based layer is suitably formed, it will act as the substrate for growing GaN p-n diode layers to form LEDs. The top layer can be again an epitaxial ZnO with Ga doping to make high conducting n-type ZnO to act as a top electrode. This is highly transparent, which allows more light coming out of the LED. The traditional Au—Ni thin films electrodes transmit light around 70 to 80%, but the proposed Ga/ZnO top layer allows more than 90% light and enhances the efficiency of the LEDs.

Returning to FIG. 1, the embodiment of the semiconductor device shown includes the optional catalyst-bearing layer 30 comprising a metal. The metal catalyst is chosen from Ti, Ni, Co, Cr, Fe, Mn, Au and Pt. The ZnO-based layer comprising nanostructures 40, in this embodiment, overlays the catalyst-bearing layer 30. Additionally, the embodiment shown in FIG. 1 includes one optional epitaxial layer 50 comprising, for example, doped or undoped GaN, which overlays the ZnO-based layer 40. Of course, the semiconductor device 10 may include one or more additional epitaxial layers (not shown in FIG. 1), each of which may have the same or different composition from one another and the initial epitaxial layer 50.

Figure 2:
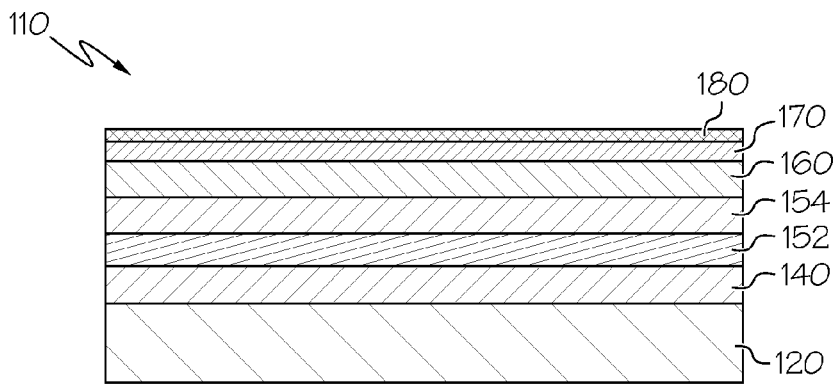
FIG. 2 is a cross-sectional view of a semiconductor device showing the layers thereof in accordance with another exemplary embodiment.

With reference now to FIG. 2, another embodiment of the semiconductor device 110 is shown, which does not include a catalyst-bearing layer. Rather, the semiconductor device 110 of FIG. 2 comprises a Si-based substrate 120 and a ZnO-based layer comprising nanostructures 140 overlaying the substrate 120. The embodiment shown in FIG. 2 also includes two epitaxial layers: a first epitaxial layer 152 comprising, for example, doped or undoped ZnO that overlays the ZnO-based layer 140, and a second epitaxial layer 154 comprising, for example, doped or undoped GaN which overlays the first epitaxial layer 152.

With reference to the embodiment shown in FIG. 2, directly on top of the second epitaxial layer 154, a pair of adjacent p-n junction forming layers has been deposited. More particularly, an n-type epitaxial layer 160 comprising, for example, doped or undoped GaN, overlays the second epitaxial layer 152. A corresponding p-type epitaxial layer 170 comprising, for example, p-type doped or undoped GaN, overlays the n-type epitaxial layer 160. An electrode layer 180 is shown overlaid on the p-type epitaxial layer 170.

Figure 3:
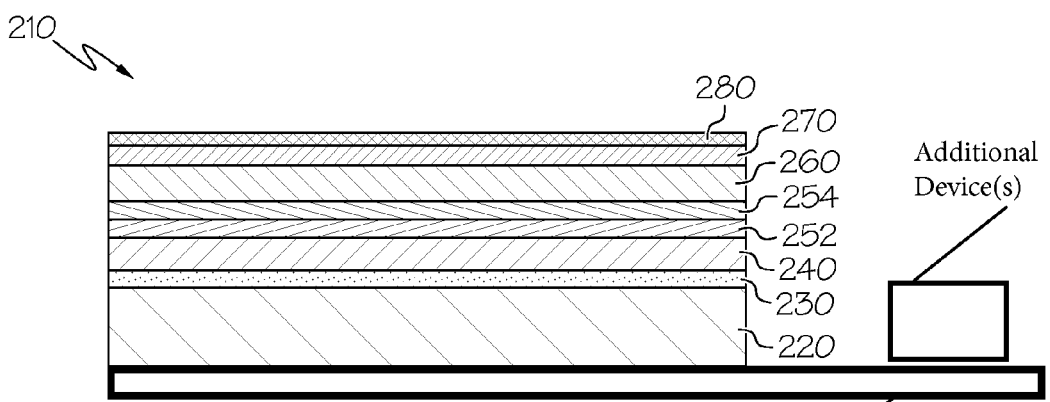
FIG. 3 is a cross-sectional view of a semiconductor device showing the layers thereof in accordance with a further exemplary embodiment.

With reference to FIG. 3, still another embodiment of the semiconductor device 210 is shown, which includes a catalyst-bearing layer 230 with the ZnO-based layer comprising nanostructures 240 overlaying the catalyst-bearing layer 230. This embodiment also includes two epitaxial layers: a first epitaxial layer 252 comprising, for example, doped or undoped ZnO overlaying the ZnO-based layer 240, and a second epitaxial layer 254 comprising, for example, doped or undoped GaN overlaying the first epitaxial layer 252. Like the embodiment of FIG. 2, this embodiment shown in FIG. 3, a pair of adjacent p-n junction forming layers overlays the second epitaxial layer 254. More particularly, an n-type epitaxial layer 260 overlays the second epitaxial layer 254 and a corresponding p-type epitaxial layer 270 overlays the n-type epitaxial layer 260. Each of the n-type and p-type epitaxial layers 260, 270 may, for example, comprise doped or undoped GaN. An electrode layer 280 is shown overlaying the p-type epitaxial layer 270.

It is noted that, as will be readily understood by persons of ordinary skill in the relevant art, while the foregoing embodiments are shown in FIGS. 1, 2 and 3 as having the p-n junction formed by a homojunction, i.e., layers of the same chemical composition such as n-type GaN and p-type GaN, the semiconductor device described herein may also have its semiconductor layers forming a heterojunction. For example, the n-type epitaxial layer 60, 160, 260 may comprise doped or undoped GaN, while the adjacent p-type epitaxial layer 70, 170, 270 may comprise doped or undoped ZnO, or even vice-versa. Furthermore, one of the p-type and n-type epitaxial layers may comprise a doped metal oxide, while the other may comprise an undoped metal oxide.

Another exemplary embodiment provides a method for producing the above-described semiconductor device 10, 110, 210. Such method comprises: providing a Si-based substrate 20, 120 220; overlaying the ZnO-based layer comprising nanostructures 40, 140, 240 on the Si-based substrate 20, 120 220; overlaying the pair of adjacent p-n junction forming layers 60, 70, 160, 170, 260, 270 on the ZnO-based layer 40, 140, 240; and overlaying the top electrode layer 80, 180, 280 on the pair of adjacent p-n junction forming layers 60, 70, 160, 170, 260, 270. As described hereinabove, the ZnO-based layer 40, 140, 240 comprises one or more nanostructures chosen from: nanofibers, nanowires, and nanorods. As is known to persons of ordinary skill in the art, the overlaying steps may be accomplished by a chemical vapor deposition technique, atomic layer epitaxy (ALE) or molecular beam epitaxy (MBE). Preferably, one or more of the overlaying steps is performed using metal organic chemical vapor deposition (MOCVD).

Additionally, in some embodiments, the method further comprises overlaying a catalyst-bearing layer 30, 230 on the Si-based substrate 20, 220 the catalyst-bearing layer 30, 230 comprising a metal chosen from: Ti, Ni, Co, Cr, Fe, Mn, Au, Pt, and combinations thereof. Preferably the metal is chosen from Co, Fe and Au, and combinations thereof. Also in some embodiments, whether or not a catalyst-bearing layer 30, 230 is overlaid on the substrate 20, the method may further comprise the step of overlaying one or more epitaxial layers 50 on the ZnO-based layer 40.

In some embodiments, an integrated circuit is provided comprising: a substrate; and a semiconductor device 10, 110, 210 disposed on said substrate. In such embodiments, the semiconductor device is as described hereinabove and comprises: a Si-based substrate; a ZnO-based layer comprising nanostructures overlaying the Si-based substrate; a pair of adjacent p-n junction forming layers overlaying the ZnO-based layer, wherein one of the pair is an n-type epitaxial layer, and the other is a p-type epitaxial layer; and a top electrode layer overlaying the pair of adjacent p-n junction forming layers. The semiconductor device may further comprise a catalyst-bearing layer overlaying the Si-based substrate.

The integrated circuit is not particularly limited and may further include a power source, one or more switches, as well as other devices in addition to the semiconductor device, or even more than one semiconductor device, or any combination thereof. Such device should be connected to one another in series and, directly or indirectly, to the power source. Moreover, as will be recognized by persons of ordinary skill, the integrated circuit may further comprise a logical circuit and more than one switch.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

Example

An Si(111) polished substrate of 20.32 cm (8 inch) diameter is chemically cleaned using $H_2SO_4/H_2O_2$ solution and treated with buffered HF solution. An MOCVD (metal organic chemical vapor deposition) reactor is used for depositing all the proposed layers. Metal nanoparticles like Ni, Fe, Au, etc of few nanometers diameter are deposited on top of the Si(111) substrate using metal-organic precursors and an $H_2$ and $N_2$ gas mixture as carrier gas. On top of this layer, ZnO nanorods/nanowires of a few hundred nanometers to few hundred microns are grown using oxygen partial pressure along with the carrier gas mixture. A slow growth rate is employed to grow these nanorods/nanowires. GaN epitaxial films of few microns thick are grown on top of this layer using tri-methyl-gallium as a precursor and ammonia as a nitridation source. GaN epitaxial layer with Si as n-type dopant is grown using $SiH_4$ as a precursor gas. On top of this n-type GaN layer, a p-type GaN epitaxial layer is grown employing bis-cyclopentadienyl-magnesium (Cp2Mg) as Mg precursor. A top electrode is grown over the p-type GaN epitaxial layer and comprises Ga doped ZnO.

Similarly AlN, AlGaN and InGaN LED structures are grown in the place of GaN, depending upon the band gap requirements to produce a particular wavelength (color) of light. For example: for deep UV, AlN layers are included; for UV, GaN layers are included; for blue, AlGaN layers are included; and for green, InGaN layers are included. Standard fabrication techniques are employed to make LEDs, as well as wiring connections and electrode formation.

What is claimed is:

1. A semiconductor device comprising:
   a Si-based substrate comprising a planar substrate upper surface;
   a ZnO-based layer comprising nanostructures overlaying said Si-based substrate, the ZnO-based layer comprising a planar ZnO-based layer upper surface that extends parallel to the substrate upper surface;
   a pair of adjacent p-n junction forming layers overlaying said ZnO-based layer, wherein one of said pair is an n-type epitaxial layer, and the other is a p-type epitaxial layer, wherein a lower layer of said pair has a planar p-n layer lower surface that extends parallel to the ZnO-based layer upper surface; and
   a top electrode layer overlaying said pair of adjacent p-n junction forming layers.

2. The semiconductor device of claim 1, wherein the device is a light emitting diode (LED) or a power transistor.

3. The semiconductor device of claim 1, wherein said Si-based substrate is a single crystal comprising one or more compounds selected from the group consisting of: Si(100) and Si(111).

4. The semiconductor device of claim 1, wherein said Si-based substrate has a diameter of between about 15.24 to about 38.1 cm (about 6 to about 15 inches).

5. The semiconductor device of claim 4, wherein the diameter of said Si-based substrate is between 20.32 to about 30.48 cm (about 8 to about 12 inches).

6. The semiconductor device of claim 1, wherein said ZnO-based layer comprises one or more nanostructures chosen from: nanofibers, nanowires, and nanorods.

7. The semiconductor device of claim 1, where said ZnO-based layer comprises undoped ZnO, doped ZnO, or both.

8. The semiconductor device of claim 7, wherein the doped ZnO of said ZnO-based layer further includes one or more elements selected from the group consisting of: Al, Ga, and In.

9. The semiconductor device of claim 1, wherein the n-type and p-type epitaxial layers of said pair of adjacent p-n junction forming layers have compositions that are the same or different from each another, and each comprises a compound chosen from: doped or undoped GaN, doped or undoped ZnO, doped or undoped AlN, doped or undoped AlGaN, doped or undoped InGaN.

10. The semiconductor device of claim 1, further comprising a catalyst-bearing layer comprising a metal chosen from: Ti, Ni, Co, Cr, Fe, Mn, Au, Pt, and combinations thereof, wherein said catalyst-bearing layer overlays said Si-based substrate.

11. The semiconductor device of claim 1, further comprising one or more epitaxial layers overlaying said ZnO-based layer.

12. The semiconductor device of claim 11, wherein each of said one or more epitaxial layers has a composition that is the same or different from any other epitaxial layer, and each comprises an oxide chosen from: doped or undoped GaN, doped or undoped ZnO, doped or undoped AlN, doped or undoped AlGaN, and doped or undoped InGaN.

13. A semiconductor device comprising:
    a Si-based substrate comprising a planar substrate upper surface;
    a catalyst-bearing layer overlaying said Si-based substrate and comprising a metal chosen from: Ti, Ni, Co, Cr, Fe, Mn, Au, Pt, and combinations thereof;
    a ZnO-based layer comprising nanostructures overlaying said catalyst-bearing layer, the ZnO-based layer comprising a planar ZnO-based layer upper surface that extends parallel to the substrate upper surface;
    a pair of adjacent p-n junction forming layers overlaying said ZnO-based layer, wherein one of said pair is an n-type epitaxial layer, and the other is a p-type epitaxial layer, wherein a lower layer of said pair has a planar p-n layer lower surface that extends parallel to the ZnO-based layer upper surface; and
    a top electrode layer overlaying said pair of adjacent p-n junction forming layers.

14. The semiconductor device of claim 13, wherein said Si-based substrate has a diameter of between about 15.24 to about 38.1 cm (about 6 to about 15 inches).

15. The semiconductor device of claim 13, wherein said ZnO-based layer comprises one or more nanostructures chosen from: nanofibers, nanowires, and nanorods.

16. The semiconductor device of claim 13, further comprising one or more epitaxial layers overlaying said ZnO-based layer.

17. An integrated circuit comprising:
    a substrate; and
    a semiconductor device disposed on said substrate, wherein said semiconductor device comprises:
    a Si-based substrate comprising a planar substrate upper surface;
    a ZnO-based layer comprising nanostructures overlaying said Si-based substrate, the ZnO-based layer comprising a planar ZnO-based layer upper surface that extends parallel to the substrate upper surface;
    a pair of adjacent p-n junction forming layers overlaying said ZnO-based layer, wherein one of said pair is an n-type epitaxial layer, and the other is a p-type epitaxial layer, wherein a lower layer of said pair has a planar p-n layer lower surface that extends parallel to the ZnO-based layer upper surface; and
    a top electrode layer overlaying said pair of adjacent p-n junction forming layers.

18. The integrated circuit of claim 17, wherein said semiconductor device is a power transistor-based device.

19. The integrated circuit of claim 17, further comprising one or more additional devices disposed on said substrate.

20. The integrated circuit of claim 17, wherein said ZnO-based layer of said semiconductor device comprises one or more nanostructures chosen from: nanofibers, nanowires, and nanorods.

* * * * *